(12) United States Patent
Zhang et al.

(10) Patent No.: US 9,910,356 B2
(45) Date of Patent: Mar. 6, 2018

(54) METHOD OF PATTERNING THIN FILMS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Lei Zhang, Beijing (CN); Zhuyi Luo, Beijing (CN); Xiangming Meng, Beijing (CN); Jinho Youn, Beijing (CN); Jianqiang Guo, Beijing (CN); Honglin Liao, Beijing (CN)

(73) Assignees: BOE TECHNOLOGY GROUP CO., LTD., Beijing (CN); HEFEI BOE OPTOELECTRONICS TECHNOLOSY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/894,699

(22) PCT Filed: Apr. 27, 2015

(86) PCT No.: PCT/CN2015/077522
§ 371 (c)(1),
(2) Date: Nov. 30, 2015

(87) PCT Pub. No.: WO2016/095393
PCT Pub. Date: Jun. 23, 2016

(65) Prior Publication Data
US 2016/0363865 A1    Dec. 15, 2016

(30) Foreign Application Priority Data
Dec. 15, 2014    (CN) .......................... 2014 1 0776113

(51) Int. Cl.
*G03C 5/04*      (2006.01)
*G03F 7/20*      (2006.01)
*G03F 7/00*      (2006.01)
*G03F 7/16*      (2006.01)
*G03F 7/32*      (2006.01)
*G03F 7/40*      (2006.01)

(52) U.S. Cl.
CPC .......... *G03F 7/2022* (2013.01); *G03F 7/0007* (2013.01); *G03F 7/16* (2013.01); *G03F 7/203* (2013.01); *G03F 7/2008* (2013.01); *G03F 7/32* (2013.01); *G03F 7/40* (2013.01)

(58) Field of Classification Search
USPC ................................................ 430/394, 396
See application file for complete search history.

(56) References Cited

U.S. PATENT DOCUMENTS

| 6,226,074 B1 * | 5/2001 | Fujisawa ............. G03F 7/70633 355/53 |
| 6,881,524 B2 | 4/2005 | Cauchi et al. |
| 8,399,162 B2 | 3/2013 | Hsieh et al. |
| 2003/0022071 A1 * | 1/2003 | Sugita ..................... G03F 1/144 430/5 |

FOREIGN PATENT DOCUMENTS

| CN | 103163730 A | 6/2013 |
| CN | 104460227 A | 3/2015 |

OTHER PUBLICATIONS

International Search Report & Written Opinion Appln. No. PCT/CN2015/077522; dated Sep. 9, 2015.

* cited by examiner

*Primary Examiner* — Daborah Chacko-Davis
(74) *Attorney, Agent, or Firm* — Ladas & Parry LLP

(57) ABSTRACT

A method of patterning a thin film is provided. The method includes coating a thin film layer and photoresist on a surface of a substrate; forming a first partially cured zone by performing a first exposing process of the photoresist with a mask, wherein exposing energy applied to the photoresist of the first partially cured zone is less than a photosensitive threshold of the photoresist; forming a cured zone on the first partially cured zone by performing a second exposing process of the photoresist with the mask, wherein a width of the cured zone is less than a width of the first partially cured zone, and exposing energy applied to the photoresist of the cured zone is equal to or greater than the photosensitive threshold of the photoresist; developing the photoresist; etching the thin film layer that is not covered by the photoresist; and removing the photoresist of the cured zone.

20 Claims, 5 Drawing Sheets

METHOD OF PATTERNING THIN FILMS

TECHNICAL FIELD

Embodiments of the present invention relate to a method of patterning a thin film.

BACKGROUND

A thin-film-transistor liquid-crystal-display (TFT-LCD) is usually used as a panel display device. The TFT-LCD is increasingly applied in the high performance display field as it has advantages of small size, low power consumption, non-radiation and low manufacture cost and the like.

SUMMARY

Embodiments of the present invention provide a method of patterning a thin film.

According to an aspect of the present invention, a method of patterning a thin film is provided. The method includes: coating a thin film layer on a surface of a substrate; coating photoresist on a surface of the thin film layer; forming a first partially cured zone by performing a first exposing process of the photoresist with a mask, wherein exposing energy applied to the photoresist of the first partially cured zone is less than a photosensitive threshold of the photoresist; forming a cured zone on the first partially cured zone by performing a second exposing process of the photoresist with the mask, wherein the cured zone has a width less than that of the first partially cured zone, exposing energy applied to the photoresist of the cured zone is greater than a photosensitive threshold of the photoresist; developing the photoresist; etching the thin film layer that is not covered by the photoresist; and stripping the photoresist of the cured zone.

BRIEF DESCRIPTION OF THE DRAWINGS

Embodiments of the present invention will be described in detail hereinafter in conjunction with accompanying drawings to allow those skilled in the art to understand the present invention more clearly, in which.

DETAILED DESCRIPTION

Figure 1:
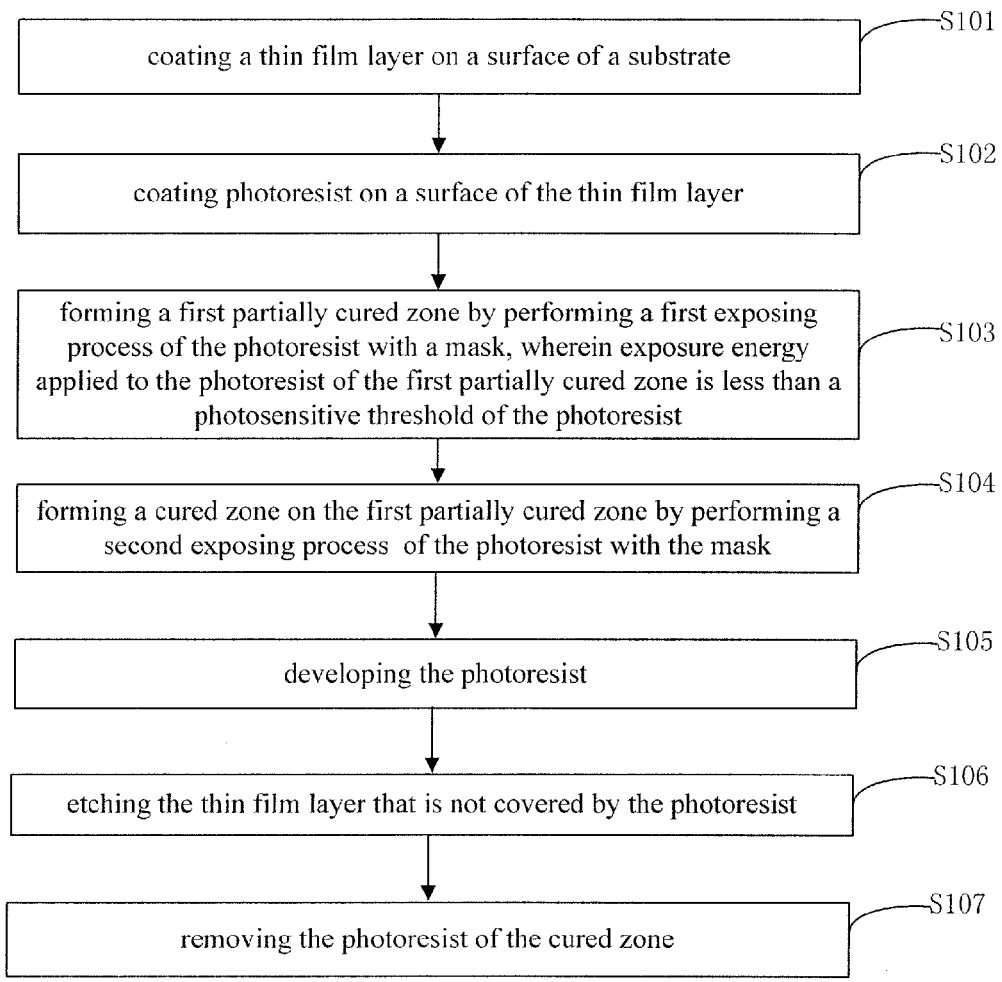
FIG. 1 is a flow diagram of a method of patterning a thin film according to an embodiment of the present invention.

Technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising." "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly. For example, as used in embodiments of the present invention, terms "on" and "under/below" are interpreted with reference to a sequence when films are formed, for example, a film defined as being on the other film is a film formed later with respective to the other film, and a film defined as being under/below the other film is a film formed previously with respective to the other film.

The TFT-LCD includes a color film substrate and an array substrate bonded to each other. The array substrate includes a plurality of horizontally and vertically intersected gate lines and data lines, and the intersected gate lines and data lines define a plurality of pixel units. The number of the pixel units is related to the resolution of a liquid crystal display. In order to meet a development trend of the liquid crystal display with high resolution, it needs to increase the number of pixel units in unit area, and the line width of the gate lines and the data lines or other thin film layer patterns located on the array substrate and the color film substrate becomes smaller and smaller. For example, when the resolution of the liquid crystal display is increased from 200 PPI (Pixels per Inch) to 300 PPI, the line width of the data lines needs to be decreased from 4 μm to 2-3 μm.

The above thin film layer pattern can be fabricated by using a process of mask exposure and development. When the line width of the thin film layer pattern needs to be decreased, it can be achieved by decreasing a size of opening area of the mask. However, the inventors notice that the size of opening area of the mask would be small for a display with high resolution since the line width of the thin film layer pattern is too small. As such, it would reduce amount of light transmitted through the opening area during the exposing procedure, and lead to underexposing, so that the formed thin film layer pattern would lack a large area or lead to producing film defect, such as a bad slope formation degree at the boundary of the thin film layer pattern, thereby reducing the product quality.

The embodiment of the present invention provides a method of patterning a thin film, as shown in FIG. 1. The method includes the following steps.

Figure 2A:
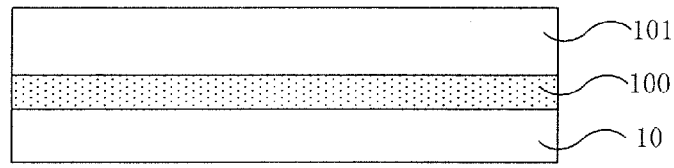
FIG. 2a-2e are schematic structural views corresponding to each step of the method of patterning the thin film according to an embodiment of the present invention.

S101, a layer of thin film 100 is coated on a surface of a substrate 10, as shown in FIG. 2a.

S102, photoresist 101 is coated on a surface of the thin film layer 100.

Figure 2B:
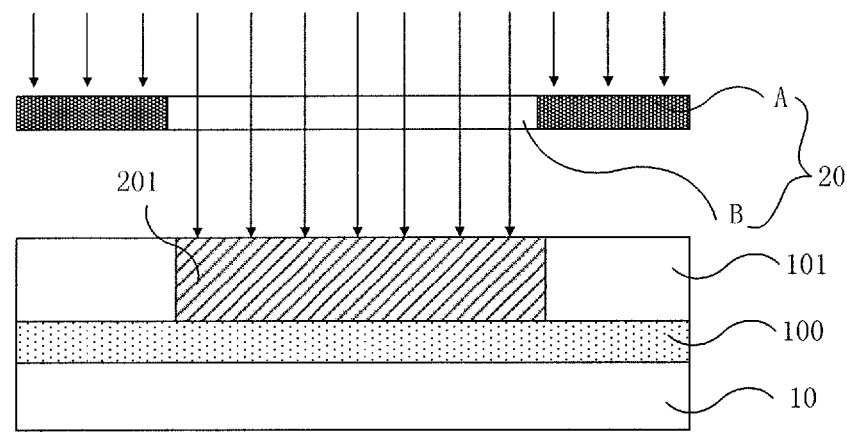

S103, a first partially cured zone 201 is formed by performing a first exposing process of the photoresist 101 with a mask 20. The exposing energy applied to the photoresist of the first partially cured zone 201 is less than a photosensitive threshold E of the photoresist 101, so that the photoresist 101 of the first partially cured zone 201 is in partially cured state, as shown in FIG. 2b.

The mask 20 can include a light-shielding region A and a light-transmitting region B. The light transmits through the light-transmitting region B to expose the photoresist 101.

Figure 2C:
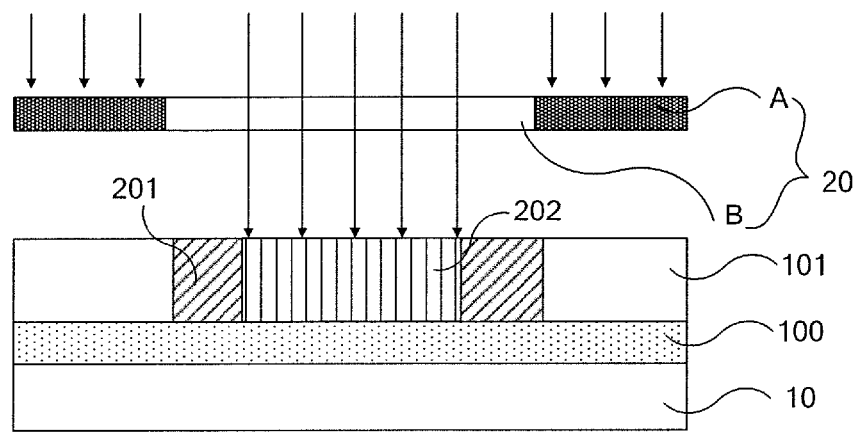

S104, a cured zone 202 is formed on the first partially cured zone 201 by performing a second exposing process of the photoresist 101 with the mask 20, as shown in FIG. 2c.

The cured zone 202 has a width less than that of the first partially cured zone 201, the exposing energy applied to the photoresist 101 of the cured zone 202 is greater than the photosensitive threshold E of the photoresist 101 so that the photoresist of the cured zone is in a full cured state.

Furthermore, the exposing energy applied to the photoresist 101 of the cured zone 202 refers to a sum of the exposing energy applied to the photoresist 101 in the first exposing process with a mask and the exposing energy applied to the photoresist 101 in the second exposing process with the mask. In this way, the sum of the two exposing energy reaches to the photosensitive threshold of the photoresist 101, so that the photoresist of the cured zone 202 is fully cured.

Figure 2D:
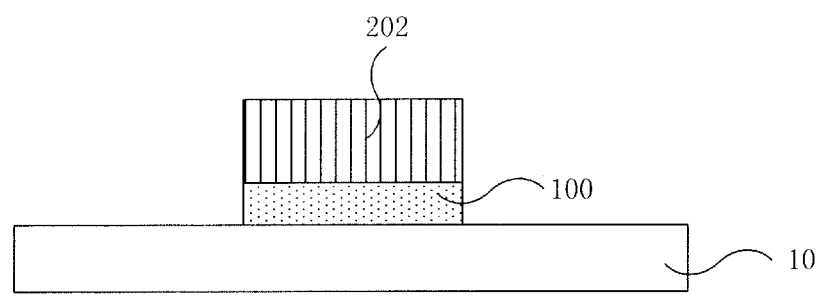

S105, the photoresist 101 is developed, as shown in FIG. 2d.

S106, the thin film layer 100 which is not covered by the photoresist 101 is etched.

Figure 2E:
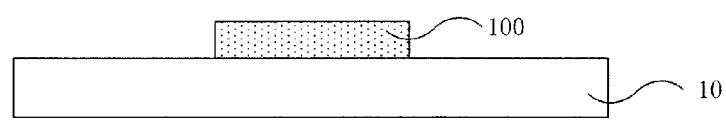

S107, the photoresist 101 of the cured zone 202 is removed to form a pattern of the thin film layer. The width of the cured zone 202 is less than that of the thin film layer pattern which is obtained by performing mask exposing, developing process and the like via the above mask 20, so that the line width of the thin film layer pattern can be decreased, as shown in FIG. 2e.

It is noted that, firstly, the photosensitive threshold E of the photoresist 101 is the exposing energy that is required to fully cure the photoresist 101 when it is exposed. When the exposing energy is less than the photosensitive threshold E of the photoresist 101, the photoresist 101 is partially cured rather than fully cured. When the exposing energy is equal to or greater than the photosensitive threshold E of the photoresist 101, the photoresist 101 is fully cured.

Therefore, the photoresist 101 of the partially cured zone (e.g. a first partially cured zone 201) is in a partially cured state, and the photoresist 101 of the cured zone is in a full cured state.

Secondly, the method of patterning the thin film layer is widely used in the procedure of fabricating the display device. The display device can include a color film substrate and an array substrate bonded to each other. Both of the color film substrate and the array substrate include a plurality of thin film layers. Each of the thin film layers can have different patterns according to different functions.

Therefore, on the one hand, the pattern of the above thin film layer 100 can be a color film layer or a black matrix film layer. After the above process of patterning the thin film layer is performed, the obtained black matrixes are horizontally and vertically disposed, which corresponds to the non-display area of the array substrate, and the color film layers are arranged in matrix regions defined by the horizontally and vertically disposed black matrixes, which correspond to display area of the array substrate.

On the other hand, the pattern of the above thin film layer 100 can include a gate line film layer, a data line film layer or a common electrode line film layer and the like. After the above process of patterning the thin film layer is performed, the obtained gate lines and date lines are arranged intersectedly to define pixel units. The common electrode line can be arranged in parallel to the gate line. When the line width of the gate line and the line width of the date line were decreased, there would have more spaces to form more pixel units, so that higher PPI (Pixels Per Inch) is achieved.

The substrate 10 can be a transparent substrate which is used to form the above thin film layer. The substrate 10 can also be a substrate on which the thin film pattern has been formed. For example, when the thin film layer 100 is a data metal layer which is used to fabricate the data lines, the substrate 10 can be a substrate on which the gate line pattern, the gate insulating layer, an active layer pattern have been formed.

An embodiment of the present invention provides a method of patterning a thin film. The method includes: coating a thin film layer on a surface of a substrate; coating photoresist on a surface of the thin film layer, forming a first partially cured zone by performing a first exposing process of the photoresist with a mask. The exposing energy applied to the photoresist of the first partially cured zone is less than or equal to the photosensitive threshold of the photoresist so that a portion of the photoresist located at the first partially cured zone is in a partially cured state; then, under the condition of positions of a light-shielding region and a light-transmitting region of the mask being unchanged, forming a cured zone on the first partially cured zone by performing a second exposing process of the photoresist with the mask. The width of the cured zone is less than that of the first partially cured zone and the exposing energy applied to the photoresist of the cured zone is equal to or greater than the photosensitive threshold of the photoresist, so that the photoresist located at the cured zone is in a cured state. Next, developing the photoresist; etching the thin film layer that is not covered by the photoresist; and removing the photoresist of the cured zone. In the above manufacturing method, the same mask is used to perform two exposing processes with different exposing energy, a size of the cured zone formed in the second exposing process is less than the width of the first partially cured zone formed in the first exposing process so that the line width of the thin film layer pattern covered by the cured zone is less than that of the thin film layer pattern which is obtained by performing exposing, developing and etching process or the like via the above mask, so that the line width of the thin film layer pattern can be decreased. Since the opening area of the mask is not decreased in the procedure of reducing the line width, it can avoid a film defect caused by underexposing due to a small opening area of the mask, and it can improve the product quality.

The method of patterning the thin film will be described in detail hereinafter by way of example.

Embodiment 1

Since the light that transmits through the light-transmitting region B of the mask 20 is not evenly distributed in the procedure of mask exposing process, the photoresist 101 corresponding to a region in which the light is concentratedly distributed is quickly cured and the photoresist 101 corresponding to a region in which the light is dispersedly distributed is slowly cured within a same exposure time period. Furthermore, the two exposing processes in the embodiment of the present invention use a same mask, therefore, the light having different glow distributions can be used to expose the photoresist 101 to form exposing regions having different widths.

Figure 3A:
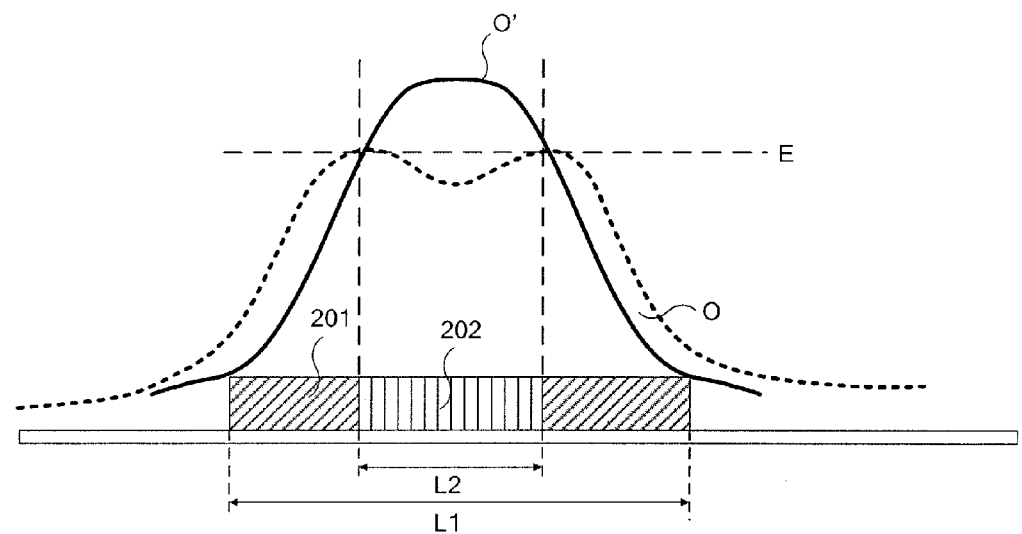
FIG. 3a is a glow distribution curve of the light used in the method of patterning the thin film according to an embodiment of the present invention.

For example, as shown in FIG. 3a, a glow distribution curve O of the light used by the first exposing process and a glow distribution curve O' of the light used by the second exposing process intersect each other, since the photoresist 101 corresponding to the intersection positions is subjected to the sum of two exposing energy which reaches to the photosensitive threshold E of the photoresist 101, the photoresist 101 corresponding to the intersection positions of two curves is fully cured, and the cured zone 202 is formed. The remained portion of the exposed photoresist 101 is in a partially cured state, because the sum of the two exposing energy does not reach to the photosensitive threshold E of the photoresist 101.

Figure 3B:
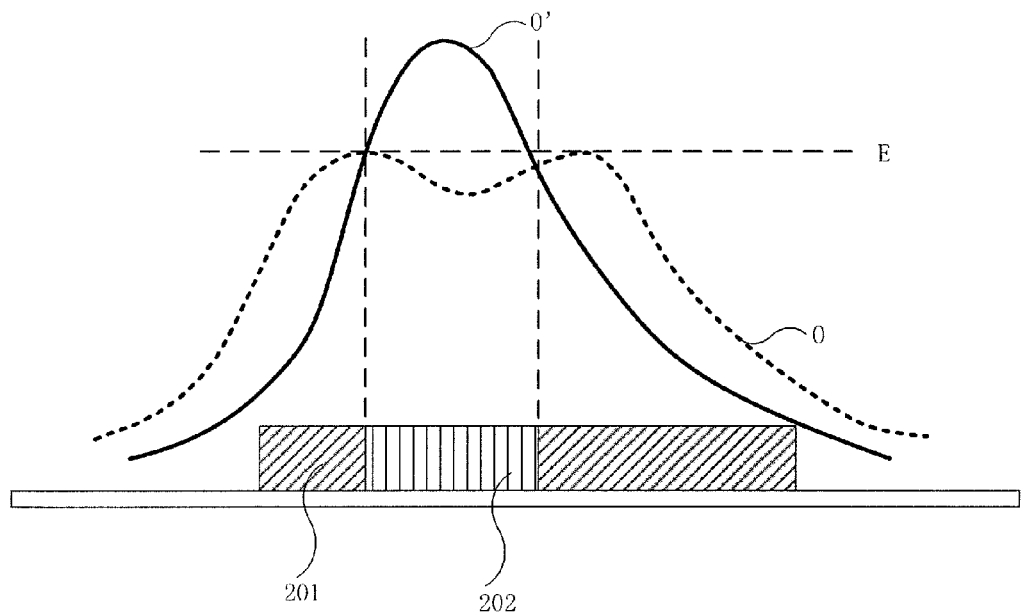
FIG. 3b is a glow distribution curve of the light used in another method of patterning the thin film according to an embodiment of the present invention.

Furthermore, it can be seen from the glow distribution curve of the light used by the second exposing process that the light is concentratedly distributed in the central portion of the light-transmitting region B, and light intensity is bigger and exposing energy is greater in the central position of the light-transmitting region B, therefore, the formed cured zone 202 is located at the center of the first partially cured zone 201. When the second exposing process is performed, the glow distribution curve O' of the used light is as shown in FIG. 3b, the light is concentratedly distributed in the left portion of the light-transmitting region B, and the light intensity and exposing energy is greater in the left portion of the light-transmitting region B, the formed cured zone 202 is located at left side of the first partially cured zone 201.

The position of the cured zone 202 located in the first partially cured zone 201 can change according to different glow distribution curves O' of the light used in the second exposing process. Certainly, the above description about the glow distribution curve O' of the light is illustrative, other glow distribution curves of light are also possible but not repeated herein, but they should all fall into the scope of the present invention.

It is noted that the light source that is used to perform the second exposing process of the photoresist 101 via the mask 20 can be provided separately, which is different from the light source used in the first exposing process.

Alternately, the light from the light source used in the first exposing process can firstly transmit through a light filter and then be used to perform the second exposing process of the photoresist 101. In such a way, the glow distribution curve can be adjusted by the above light filter. The width of the region in which the light is concentratedly distributed during the second exposing process is less than that of the light-transmitting region B of the mask during the first exposing process, so that the width of the cured zone 202 obtained by using the second exposing process is less than that of the first partially cured zone 201 obtained by using the first exposing process in order to decrease the line width of the pattern of the thin film layer 100 covered by the cured zone 202.

For example, the above light filter can include a high resolution unit (HRU), a neutral density filter (ND filter) or a cut filter. The above light filter can filter the light used in the first exposing process and filter out a part of wavelengths of the light, and remain the part of the light that has high photosensitivity for the photoresist 101. For example, if the used photoresist 101 is much photosensitive to red light, the above light filter can remain the part of the light of which wavelengths are neighboring to that of the red light, and filter out other wavelengths of the light, so that a region in which the light is concentratedly distributed is formed, which facilitates the formation of the cured zone 202.

Furthermore, it also needs to set some parameters in the above exposing procedure with the mask.

On one hand, the width L1 of the first partially cured zone 201 is directly proportional to the exposure amount α of film formation used for the first exposing process of the photoresist 101. That is, the larger the exposure amount α of the photoresist 101 is, the longer the exposure time period is, and the greater the width L1 of the first partially cured zone 201 is.

On the other hand, as above described, the width L2 of the cured zone 202 is directly proportional to the exposure amount β of film formation used for the second exposing process of the photoresist 101, and is inversely proportional to the developing and removing time period γ of the photoresist. That is, L2 is a function of β and γ: $L2=F(\beta, 1/\gamma)$.

Embodiment 2

The above step S104 further includes the following steps.

Figure 4A:
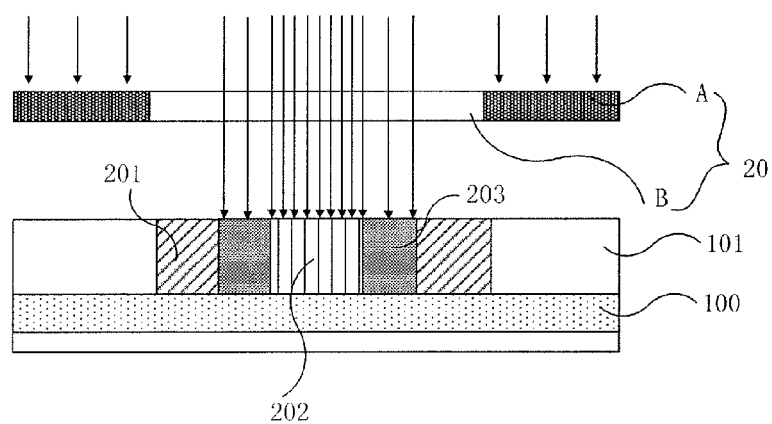
FIG. 4a is a schematic structural view of the thin film layer manufactured by the method of patterning the thin film according to an embodiment of the present invention.

As shown in FIG. 4a, a second partially cured zone 203 is formed on the first partially cured zone 201.

Figure 4B:
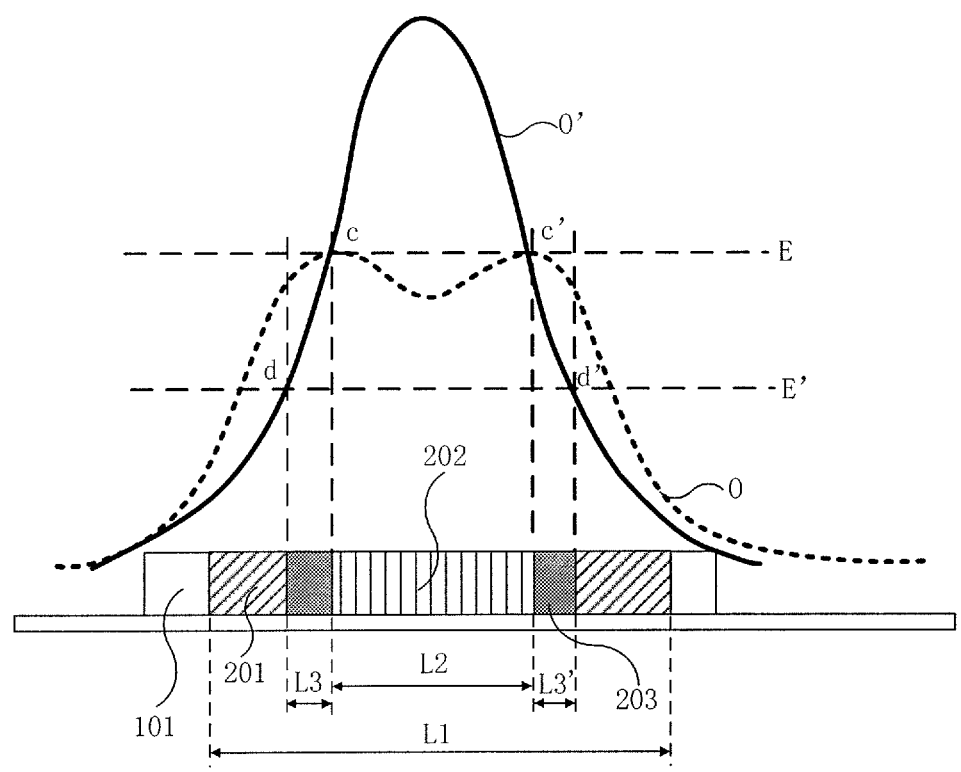
FIG. 4b is a glow distribution curve of the light ray used in still another method of patterning the thin film according to an embodiment of the present invention.

As shown in FIG. 4b, a sum (L3+L3'+L2) of the width (L3+L3') of the second partially cured zone 203 and the width (L2) of the cured zone 202 is less than the width (L1) of the first partially cured zone 201. The exposing energy applied to the photoresist of the second partially cured zone 203 is less than the photosensitive threshold E of the photoresist 101.

In such a way, the second partially cured zone 203 is formed in the second exposing process so that the width of the cured zone 202 is further decreased, and the line width of pattern of thin film layer 100 is further decreased.

It is noted that, as shown in FIG. 4b, the cured zone 202 is located at the middle of the first partially cured zone 201, and the second partially cured zone 203 is located at both sides of the cured zone 202, so that the width of the second partially cured zone 203 is L3+L3'. Certainly, the position of the above second partially cured zone 203 is determined based on the glow distribution of the light used for the exposing process. The light used for the exposing process can be selected based on the glow distribution curve of the light used for the exposing process, so that the second partially cured zone 203 is located at one side of the cured zone 202.

The procedure of forming the second partially cured zone 203 will be described in detail hereinafter with respect to the glow distribution curve as shown in FIG. 4b. In the glow distribution curve O' of the light used for the second exposing process, since a slope of the curve between node d to node c (or node d' to node c ) is bigger than a slope of the curve extending down from node d (or node d'), the exposing energy applied to the portion of the photoresist 101 corresponding to the curve between node d to node c (or node d' to node c') is greater than the exposing energy applied to the portion of the photoresist 101 corresponding to the curve extending down from node d (or node d').

The node d (or node d') is the focal point of exposing energy E and the glow distribution curve O' of the light used for the second exposing process, and the node c (or node c') is the focal point of exposing energy E' and the glow distribution curve O' of the light used for the second exposing process.

In the second exposing process, the portion of the photoresist 101 corresponding to the curve (i.e. the second partially cured zone 203) between node d to node c (or node d' to node c') has a larger curing degree than that of the portion of the photoresist 101 corresponding to the curve (i.e. the first partially cured zone 201) extending down from node d (or node d'). Although the sum of the exposing energy applied to the photoresist 101 in the two exposing processes reaches to E', since E' is still less than the photosensitive threshold E of the photoresist 101, the photoresist 101 of the formed second partially cured zone 203 is still in a partially cured state after performing the second exposing process, but that the curing degree is greater than that of the photoresist 101 of the first partially cured zone 201.

Furthermore, as can be seen from the glow distribution curve O' of the light used for the second exposing process, the region in which the light is concentratedly distributed has a smaller width than that in embodiment 1 so that the width of the correspondingly formed cured zone 202 is further decreased. Therefore, the smaller the width of the region in which the light is concentratedly distributed during the second exposing process is, the larger the slope of the glow distribution curve of the light is, then the smaller the width of the formed cured zone 202 is, so that the smaller the line width of pattern of the thin film layer 100 covered by the cured zone 202 is.

Furthermore, some parameters are set as follows in the above mask exposing procedure.

On the one hand, after the second mask exposing procedure is performed, the cured zone 202 is formed, and the second partially cured zone 203 is also formed, wherein the photoresist 101 of the second partially cured zone 203 has a larger curing degree than that of the photoresist 101 of the first partially cured zone 201. The width L2 of the cured zone 202 is related to exposure amount α of film formation used for the first exposing process of the photoresist, and it is also related to exposure amount β of film formation used for the second exposing process of the photoresist 101. Therefore, a ratio between the exposure amount α used for the first exposing process of the photoresist and the exposure amount β used for the second exposing process of the photoresist 101 can be set to 0.5.

On the other hand, during the developing and removing process following the mask exposing process, the uncured photoresist 101 needs to be processed, and the partially cured photoresist 101 in the first partially cured zone 201 and the second partially cured zone 203 needs to be processed. Therefore, the width L2 of the cured zone 202 is inversely proportional to 1.5 times of the developing and removing time period γ of the photoresist 101.

For example, the width L2 of the cured zone 202 is directly proportional to a half of the exposure amount α used for the first exposing process of the photoresist and a half of the exposure amount β used for the second exposing process of the photoresist 101, and is inversely proportional to 1.5 times of the developing and removing time period γ of the photoresist 101. That is, L2 is a function of α, β and γ: L2=F(0.5α, 0.5β, 1/1.5γ).

The embodiment of the present invention provides a method of patterning a thin film. The method includes: coating a thin film layer on a surface of a substrate; coating photoresist on a surface of the thin film layer, forming a first partially cured zone by performing a first exposing process of the photoresist with a mask, wherein the exposing energy applied to the portion of the photoresist of the first partially cured zone is less than a photosensitive threshold of the photoresist, so that the portion of the photoresist located at the first partially cured zone is in a partially cured state. Under the condition that positions of a light-shielding region and a light-transmitting region of the mask are unchanged, forming a cured zone on the first partially cured zone by performing a second exposing process of the photoresist with the same mask, wherein the cured zone has a width less than that of the first partially cured zone and the exposing energy applied to the photoresist of the cured zone is equal to or greater than a photosensitive threshold of the photoresist, so that the photoresist located at the cured zone is in a cured state. Next, developing the photoresist; etching the thin film layer that is not covered by the photoresist; and finally removing the photoresist of the cured zone. In the above manufacturing method, a same mask is used to perform two exposing processes with different exposing energy, the width of the cured zone formed in the second exposing process is less than the width of the first partially cured zone formed in the first exposing process so that the line width of the thin film layer pattern covered by the cured zone is less than that of the thin film layer pattern which is obtained by performing an exposing, developing and etching process, or the like via the above mask, and the line width of the thin film layer pattern can be decreased. The opening area of the mask is not decreased in the procedure of decreasing the line width, so that it can avoid a film defect caused by underexposing due to a small opening area of the mask, and the product quality can be improved.

It should be understood that the described above are only illustrative implementations of the present invention, and the present invention is not intended to limited thereto. For an ordinary skill in the art, various modifications and improvements may be made without departing from the spirit and scope of embodiments of the present invention, and all of which shall fall within the scope of the present invention. The scope protected by the present invention is defined by the claims.

The present application claims priority of Chinese patent application No. 201410776113.0 filed on Dec. 15, 2014 and entitled "METHOD OF PATTERNING THIN FILMS", the entire contents of which are incorporated herein by reference.

What is claimed is:

1. A method of patterning a thin film in a display device, comprising:
    coating a layer of thin film on a surface of a substrate;
    coating photoresist on a surface of the thin film layer;
    forming a first partially exposed zone by performing a first exposing process of the photoresist with a mask by using a first light having a first glow distribution, wherein exposing energy applied to the photoresist of the first partially exposed zone is less than a photosensitive threshold of the photoresist;
    forming an exposed zone and a further partially exposed zone around the exposed zone within the first partially exposed zone by performing a second exposing process of the photoresist with the mask by using a second light having a second glow distribution which is different from the first glow distribution at least in a light concentrating region, a light intensity and an exposing energy in a light-transmitting region;
    developing the exposed zone and the further partially exposed zone around the exposed zone to form a first partially cured zone and a cured zone on the first partially cured zone, wherein the cured zone has a width less than that of the first partially cured zone, and the exposing energy applied to the photoresist of the cured zone is equal to, or greater than the photosensitive threshold of the photoresist;

etching the thin film layer that is not covered by the photoresist; and removing the photoresist of the cured zone.

2. The method of patterning the thin film according to claim 1, further comprising forming a second partially cured zone around the cured zone on the first partially cured zone;

wherein a sum of the width of the second partially cured zone and the width of the cured zone is less than the width of the first partially cured zone, an exposing energy applied to the photoresist of the second partially cured zone is less than the photosensitive threshold of the photoresist.

3. The method of patterning the thin film according to claim 2, further comprising:

forming the second partially cured zone located at two sides of the cured zone.

4. The method of patterning the thin film according to claim 3, further comprising:

transmitting the light of the light source used by the first exposing process through a light filter to perform the second exposing process of the photoresist, wherein the light filter filters out a part of wavelength of the light and remain the part of the light that has high photosensitivity for the photoresist.

5. The method of patterning the thin film according to claim 4, wherein the width of the cured zone located in the first partially cured zone changes with the width of the concentrating distribution of the glow distribution curve of the light used in the second exposing process.

6. The method of patterning the thin film according to claim 5, wherein the position of the cured zone located in the first partially cured zone changes with the location of the concentrating distribution of the glow distribution curve of the light in the light-transmitting region used in the second exposing process.

7. The method of patterning the thin film according to claim 2, wherein the width of the first partially cured zone is directly proportional to exposure amount used in the first exposing process of the photoresist.

8. The method of patterning the thin film according to claim 2, wherein the width of the cured zone is directly proportional to exposure amount used in the second exposing process of the photoresist, and is inversely proportional to the developing and removing time period of the photoresist.

9. The method of patterning the thin film according to claim 2, wherein the width of the cured zone is directly proportional to a half of exposure amount used in the first exposing process of the photoresist;

the width of the cured zone is directly proportional to a half of exposure amount used in the second exposure of the photoresist; and the width of the cured zone is inversely proportional to 1.5 times of the developing and removing time period.

10. The method of patterning the thin film according to claim 1, further comprising:

forming the second partially cured zone located at two sides of the cured zone.

11. The method of patterning the thin film according to claim 10, wherein the width of the cured zone is directly proportional to a half of exposure amount used in the first exposing process of the photoresist;

the width of the cured zone is directly proportional to a half of exposure amount used in the second exposure of the photoresist; and the width of the cured zone is inversely proportional to 1.5 times of the developing and removing time period.

12. The method of patterning the thin film according to claim 10, wherein the width of the first partially cured zone is directly proportional to exposure amount used in the first exposing process of the photoresist.

13. The method of patterning the thin film according to claim 10, wherein the width of the cured zone is directly proportional to exposure amount used in the second exposing process of the photoresist, and is inversely proportional to the developing and removing time period of the photoresist.

14. The method of patterning the thin film according to claim 1, further comprising:

transmitting the light of a light source used by the first exposing process through a light filter to perform the second exposing process of the photoresist, wherein the light filter filters out a part of wavelength of the light and remain the part of the light that has high photosensitivity for the photoresist.

15. The method of patterning the thin film according to claim 14, wherein the light filter comprises at least one of a high resolution unit, a neutral density filter or a cut filter.

16. The method of patterning the thin film according to claim 1, wherein the width of the first partially cured zone is directly proportional to exposure amount used in the first exposing process of the photoresist.

17. The method of patterning the thin film according to claim 1, wherein the width of the cured zone is directly proportional to exposure amount used in the second exposing process of the photoresist, and is inversely proportional to the developing and removing time period of the photoresist.

18. The method of patterning the thin film according to claim 1, wherein the thin film layer comprises a color film layer or a black matrix film layer.

19. The method of patterning the thin film according to claim 1, wherein the thin film layer comprises a gate line film layer, a data line film layer or a common electrode line film layer.

20. The method of patterning the thin film according to claim 1, wherein the width of the cured zone is directly proportional to a half of exposure amount used in the first exposing process of the photoresist;

the width of the cured zone is directly proportional to a half of exposure amount used in the second exposure of the photoresist; and the width of the cured zone is inversely proportional to 1.5 times of the developing and removing time period.

* * * * *

UNITED STATES PATENT AND TRADEMARK OFFICE
CERTIFICATE OF CORRECTION

PATENT NO. : 9,910,356 B2
APPLICATION NO. : 14/894699
DATED : March 6, 2018
INVENTOR(S) : Zhang et al.

Page 1 of 1

It is certified that error appears in the above-identified patent and that said Letters Patent is hereby corrected as shown below:

On the Title Page

Item (73) the Second Assignee:
HEFEI BOE OPTOELECTRONICS TECHNOLOSY CO., LTD., Hefei, Anhui (CN)

Is changed to:
HEFEI BOE OPTOELECTRONICS TECHNOLOGY CO., LTD., Hefei, Anhui (CN)

Signed and Sealed this
Seventh Day of February, 2023

Katherine Kelly Vidal
*Director of the United States Patent and Trademark Office*